US006326827B1

(12) United States Patent
Cretti et al.

(10) Patent No.: US 6,326,827 B1
(45) Date of Patent: Dec. 4, 2001

(54) METHOD AND A RELATIVE DIGITAL CIRCUIT OF FEEDBACK REGULATION OF THE DUTY CYCLE OF A CLOCK SIGNAL

(75) Inventors: Francesco Cretti, Milan; Nuccio Villa, Roncello; Raffaele Izzo, Milan, all of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/653,739

(22) Filed: Sep. 1, 2000

(30) Foreign Application Priority Data

Sep. 3, 1999 (IT) .............................................. VA99A0023

(51) Int. Cl.⁷ ...................................................... H03K 7/08
(52) U.S. Cl. ............................................. 327/175; 327/35
(58) Field of Search .............................. 327/175, 35, 270, 327/271, 272, 276, 284, 155, 161, 172, 173, 174, 176, 159

(56) References Cited

U.S. PATENT DOCUMENTS

| 5,757,218 | * | 5/1998 | Blum ...................................... 327/175 |
| 5,926,053 | * | 7/1999 | McDermott et al. ................ 327/159 |
| 6,205,191 | * | 3/2001 | Portmann et al. .................... 327/161 |

* cited by examiner

Primary Examiner—Timothy P. Callahan
Assistant Examiner—Linh Nguyen
(74) Attorney, Agent, or Firm—Theodore E. Galanthay; Allen, Dyer, Doppelt, Milbrath & Gilchrist, P.A.

(57) ABSTRACT

A method for regulating the duty cycle of an input clock signal includes producing a second clock signal using a first adjustable delay circuit for varying the duty cycle. The second clock signal is applied to first and second circuits for respectively increasing and decreasing the duty cycle of the second clock signal. The method further includes monitoring if the first circuitry increases the duty cycle or if the second circuitry reducing the duty cycle saturates first. The duty cycle introduced by the first adjustable delay circuit is modified until saturation of the first and second circuits occur at substantially the same time.

24 Claims, 6 Drawing Sheets

METHOD AND A RELATIVE DIGITAL CIRCUIT OF FEEDBACK REGULATION OF THE DUTY CYCLE OF A CLOCK SIGNAL

FIELD OF THE INVENTION

The present invention relates to clock signal distribution techniques, and, in particular, to a method and circuit for regulating the duty cycle of a clock signal.

BACKGROUND OF THE INVENTION

The duty cycle of a clock signal is subjected to distortions because of asymmetries along the clock distribution tree due to load mismatches, different threshold levels, changes of logic levels (e.g., CMOS), variations of the power supply, noise, etc.

When the clock frequency approaches the maximum allowed for the technology used, problems arise in controlling the duty cycle along the clock distribution tree. On the contrary, when the clock frequency is relatively low, it becomes relatively easy to ensure good control of the duty cycle by an appropriate design. This design is dependent upon the availability of a good model of the clock tree. Poor model and/or poor design tools may lead to problems.

Duty cycle degradation is due to the use of standard buffers for distributing the clock. This is because standard buffers are usually designed for minimizing power consumption and delay figures and equalizing rise/fall delays and slopes. Duty cycle integrity is often regarded as a less important aspect when designing standard libraries.

This problem is well known and there have been several approaches for overcoming it. A significant bibliography may include the following titles:

1) EP No. 0892497-A1 titled "Procede De Multiplication De La Frequence D'un Signal D'horloge Avec Controle Du Rapport Cyclique, Et Dispositif Correspondant" (X. Cauchy—STMicroelectronics);
2) WO 97/42707, titled "Clock Signal Generator" (U. Grehl—Siemens);
3) EP No. 0930709, titled "Circuit For Producing Pulse Signal With A Desired Duty Cycle" (Y. Hiroshi—NEC);
4) U.S. Pat. No. 5,757,218, titled "Clock Signal Duty Cycle Correction Circuit And Method" (D. W. Blum—IBM);
5) U.S. Pat. No. 5,841,305, titled "Circuit And Method For Adjusting Duty Cycles" (J. E. Wilson—Cypress);
6) EP No. 0905896, titled "Output Buffer Circuit With 50% Duty Cycle" (W. Hiroyuki—NEC);
7) U.S. Pat. No. 5,856,753, titled "Output Circuit For 3V/5V Clock Chip Duty Cycle Adjustment" (P. Xu—Cypress);
8) U.S. Pat. No. 5,812,832, titled "Digital Clock Waveform Generator And Method For Generating A Clock Signal" (S. C. Horne—AMD);
9) U.S. Pat. No. 5,828,250, titled "Differential Delay Line Clock Generator With Feedback Phase Control" (K. Konno—Intel);
10) U.S. Pat. No. 5,410,263, titled "Delay Line Loop For On-chip Clock Synthesis With Zero Skew And 50% Duty Cycle" (A. Waizman—Intel);
11) U.S. Pat. No. 5,491,440, titled "Automatic Clock Duty Cycle Adjusting Circuit" (T. Uehara—Ando Electric);
12) IEEE-JSSCC, Vol. 29, No. 12, December 1994, titled "A 2.5 V CMOS DLL For An 18 Mbit, 500 Mbyte/s DRAM" (T. H. Lee et al.);
13) EP No. 98830542.1, titled "A Fully Digital Phase Aligner" (F. Cretti, N. Villa—STMicroelectronics).

The duty cycle can be controlled and adjusted by delaying each clock edge using a tapped delay line as disclosed in 1) EP No. 0892497-A1, 2) WO 97/42707, and 3) EP No. 0930709. This is not suitable at relatively high frequencies because of an excessive coarseness in the corrections.

The low speed approach disclosed in 4) U.S. Pat. No. 5,757,218 is good for portability, controllability and easy to use, but is not suited for high frequency applications because it requires a clock running much faster than the clock to be controlled.

The techniques disclosed in 5) U.S. Pat. No. 5,841,305, 6) EP No. 0905896, and 7) U.S. Pat. No. 5,856,753 are applicable to an I/O buffer pre-driver, when the signal being controlled must be adapted to a different logic level (e.g., CMOS, TTL) or to a different power supply level (2.5, 3, 5 V). These techniques are not based on feedback, and, therefore, are applicable when the adjustment is a known design constraint.

Rather complex methods for producing a clock having a controlled frequency, duty cycle and skew are disclosed in 8) U.S. Pat. No. 5,812,832, 9) U.S. Pat. No. 5,828,250, and 10) U.S. Pat. No. 5,410,263. These methods are suitable for managing clock distribution in large devices such as microprocessors, but are not easily embedded nor portable and require a rather complex design.

Several analog approaches are available, including stand alone as disclosed in 11) U.S. Pat. No. 5,491,440, or included in DLL/PLL circuits as disclosed in 12) IEEE-JSSCC, Vol. 29, No. 12, December 1994. An analog approach cannot be easily implemented in a digital environment because an analog design, while solving the adjustment of a clock, puts tight constraints on the environment (the chip) where the analog circuits are embedded. The analog approach may operate in an isolated environment but becomes prone to operating failures when neighboring digital circuits cause a disturbance. This disturbance is inevitable because of the injection of noise on sensitive parts of the analog circuit.

A rule of thumb when handling analog parts is to keep the parts isolated as much as possible from the most noisy parts of the digital sectors. This problem becomes quite serious when analog parts are co-integrated on a digital chip. It is difficult to ensure a complete isolation between the analog part and the noisy digital parts.

Existing digital approaches are not suitable for very high speed applications because both require clocks having significantly higher speed or are very complex, and, therefore, require an excessively large area of integration.

SUMMARY OF THE INVENTION

In view of the foregoing background, it is an object of the present invention to provide a method for regulating the duty cycle of a clock signal, and to provide a digital implementing circuit for doing so. The method and digital implementing circuit are relatively straightforward to implement, reliable and readily integrable. The circuit of the invention will often be referred to by the acronym DCA in the following description, which means Duty Cycle Adjuster.

This and other objects, advantages and features in accordance with the present invention is provided by a method for the closed-loop regulation of the duty cycle of an input clock signal. The method includes producing a second clock signal by a first controlled delay circuit varying the duty cycle, and providing the second clock signal to a first circuitry and to a second circuitry for respectively increasing and decreasing the duty cycle of the second clock signal.

The method further includes monitoring which of the first circuitry incrementing the duty cycle and of the second circuitry reducing the duty cycle saturates first, and regulating the delay introduced by the first controlled delay circuit until the saturation intervals of the first circuitry and of the second circuitry equal each other.

The closed-loop clock duty cycle regulating circuit of the invention comprises a controlled delay line varying the duty cycle of an input clock signal and outputting a second clock signal. A first and a second circuitry respectively increases and decreases the duty cycle of the second clock signal. The regulating circuit further includes a third circuitry producing a signal indicating which of the first and second circuits saturates first, and a fourth circuitry controlling the delay line for increasing the duty cycle of the second clock signal. The duty cycle is increased if the third circuitry detects first the saturation of the second circuitry. The duty cycle is decreased if the third circuitry detects first the saturation of the first circuitry.

The invention is effective because it optimally meets numerous important conditions or requirements, such as:

1) extension of the frequency range is no longer required because the need of a DCA (Duty Cycle Adjuster) arises only at frequencies close to the technological limit;
2) duty cycle measurement is carried out in a straightforward and precise manner without using methods based on comparisons among replicas or on the synthesis of pulses of established duration, etc.;
3) a good adjustment precision is not required, considering that in digital environments a 5% precision in a duty cycle is generally considered sufficient;
4) a very low propagation delay to satisfy possible system constraints;
5) very low area requirement and power dissipation when compared to the area of the host device and to the power dissipation of a clock distribution tree;
6) a low output jitter given that a fully digital approach is generally more effective because the corrections can be easily disabled;
7) minimum number of control signals (I/O signals of the DCA cell) required by the DCA include a signal for the input clock, a signal for the output clock and a signal for resetting; and
8) interval variation of the duty cycle of the input clock may range from 20% to 80%—such an interval is sufficient in applications using a clock frequency near the technological limit where extremely narrow pulses are not allowed.

BRIEF DESCRIPTION OF THE DRAWINGS

The different aspects and advantages of the invention will become clearer through the following description of several embodiments of the invention and by referring to the attached drawings, wherein.

DETAILED DESCRIPTION OF THE PREFERRED EMBODIMENTS

When a clock signal must be distributed throughout a system from a small IC to a complex digital environment, it is desirable to keep the duty cycle close to 50%. This allows the highest clock frequency to be reached, thus increasing immunity to noise and reducing the analog effects, such as slope degradation and jitter, for example.

Another problem to consider is that circuits using a clock, such as flip-flops, require a minimum clock pulse width. This means that when the clock frequency increases, the width of the interval centered around 50% in which the duty cycle can vary shrinks. For these reasons, several exemplary embodiments of DCAs (Duty Cycle Adjusters) regulating at 50% the duty cycle of the in put clock signal will be described, though the invention can also be implemented with values other than 50% in designing the DCA.

The method of the invention is based on a relatively straightforward and reliable way of evaluating the duty cycle. This is done by using an unbalanced delay line to change the properties of the original clock and by measuring the effects in a differential manner.

According to the method of the present invention, the following technique is used. Two unbalanced delay lines are provided. If it is necessary to regulate the duty cycle at a value of 50% these delay lines are identical. The input clock signal is input to a first line and an inverted replica of the input clock signal is input to the second line.

The duty cycle of the two signals is respectively increased and decreased a small percentage by each stage of the respective delay lines. The actual percentage of change is not critical because the detection method is differential. The delay line that reaches first saturation produces a flag signal indicating the sign of the difference between the effective duty cycle and the desired duty cycle (50%).

Figure 1:
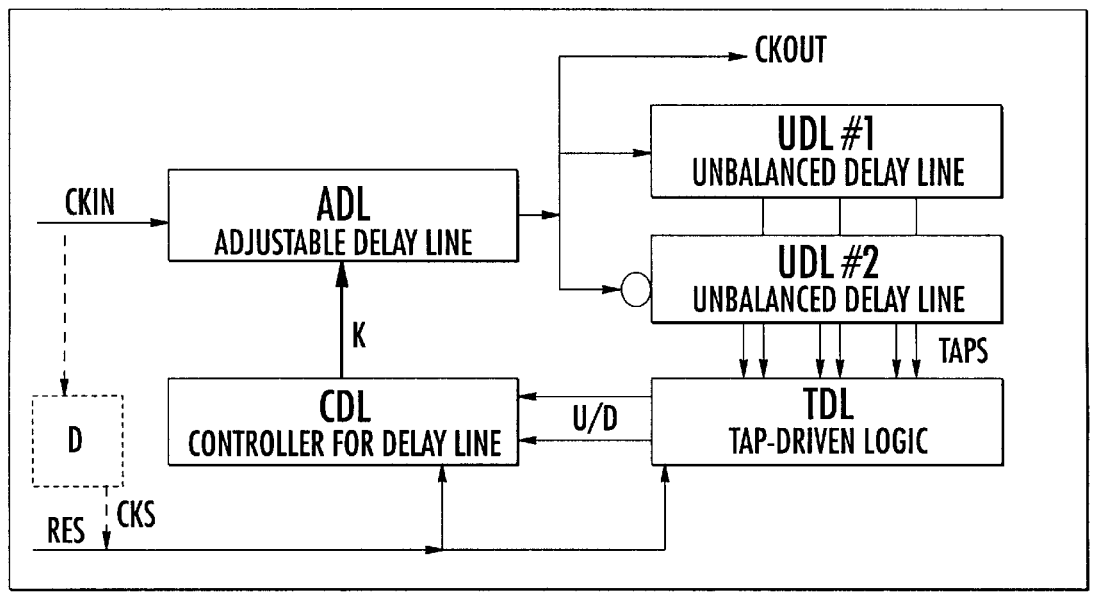
FIG. 1 is a block diagram of a first embodiment of a DCA according to the present invention.

Referring to FIG. 1, the clock signal to be processed (CKIN) is regulated by the block ADL (Adjustable Delay Line). In steady state conditions, the output CKOUT will be a clock signal with a duty cycle equal to 50%. This is obtained with a very small insertion delay with respect to CKIN.

The signal CKOUT is applied to the inputs of two identical unbalanced delay lines UDL#1 and UDL#2. The second delay line has an inverting input stage. The two UDLs degrade the duty cycle in opposite directions. The duty cycle is increased in the first UDL; and the duty cycle is reduced in the second UDL because of the input inversion.

The two sets of TAPS signals provide to the TDL (Tap-Driven Logic) block the state of the duty cycle degrading process. This means that the last TAPS signal of each UDL is fixed at 1 because the duty cycle of the signal processed in UDL#1 and UDL#2 have been increased. The TDL logic detects which of the two UDLs saturate first, and instructs the CDL (Controller for the Delay Line) for adjusting the ADL through the K bus.

The CDL sets the ADL according to the TDL instruction. In case the UDL#1 saturates first, the duty cycle must be decreased and the flag Down produced by the block TDL makes the controller CDL command a reduction of the ADL contribution to the duty cycle. In case the UDL#2 saturates first, the duty cycle must be increased and the Up flag produced by the TDL block makes the controller CDL command the ADL to increase its contribution to the duty cycle. The ADL is an Adjustable Delay Line with a small insertion delay and a separate rise/fall adjustability to modify the duty cycle in addition to the insertion delay.

Figure 2:
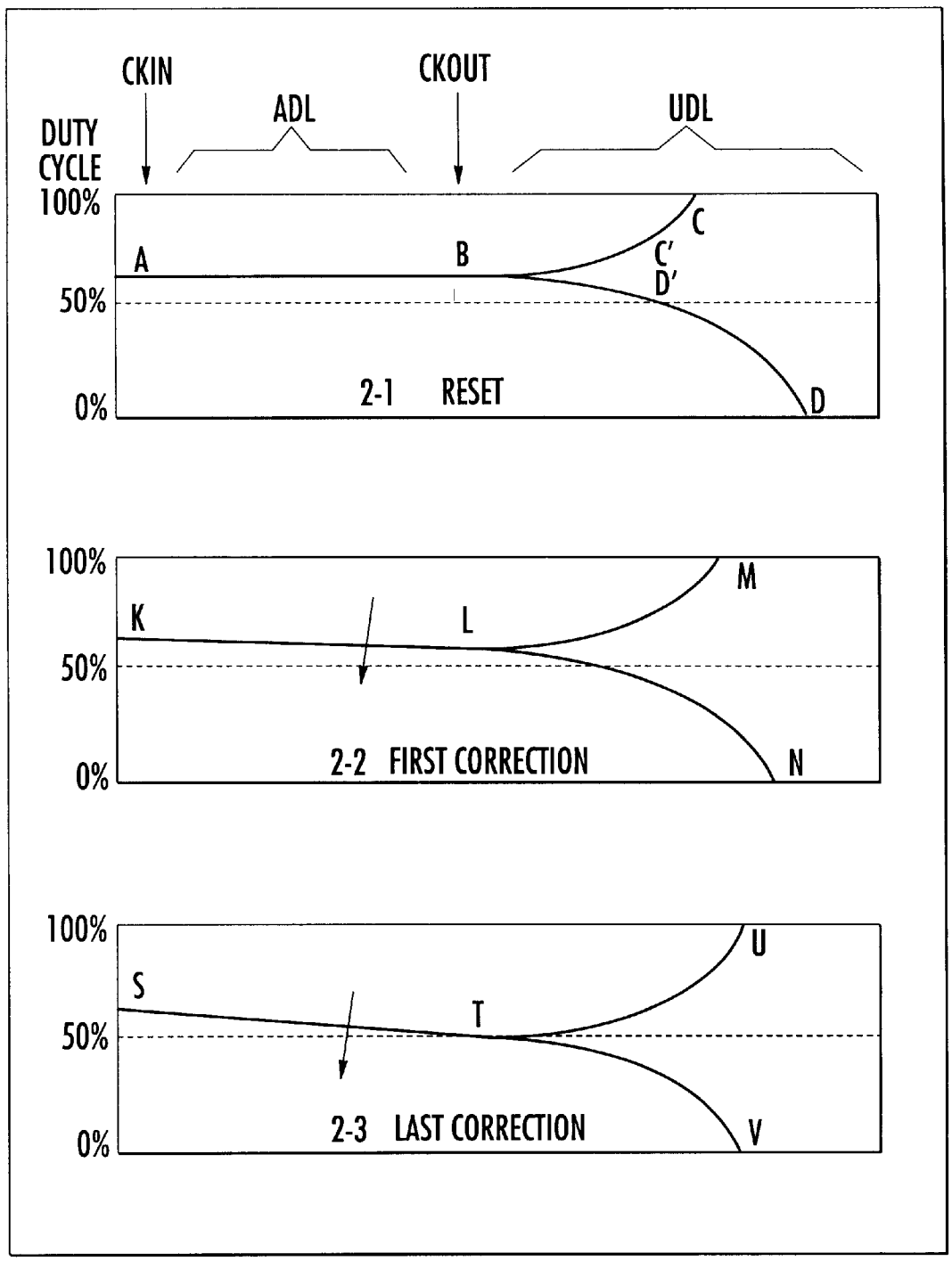
FIG. 2 is a graph illustrating the duty cycle of clock signals during corrections carried out by the DCA illustrated in FIG. 1.

The method of regulating is schematically depicted in FIG. 2, wherein the first diagram 2-1 illustrates the situation at the reset, the second diagram 2-2 illustrates the situation after a first correction, and the third diagram 2-3 illustrates the situation when the duty cycle is close to the desired 50%.

Figure 3:
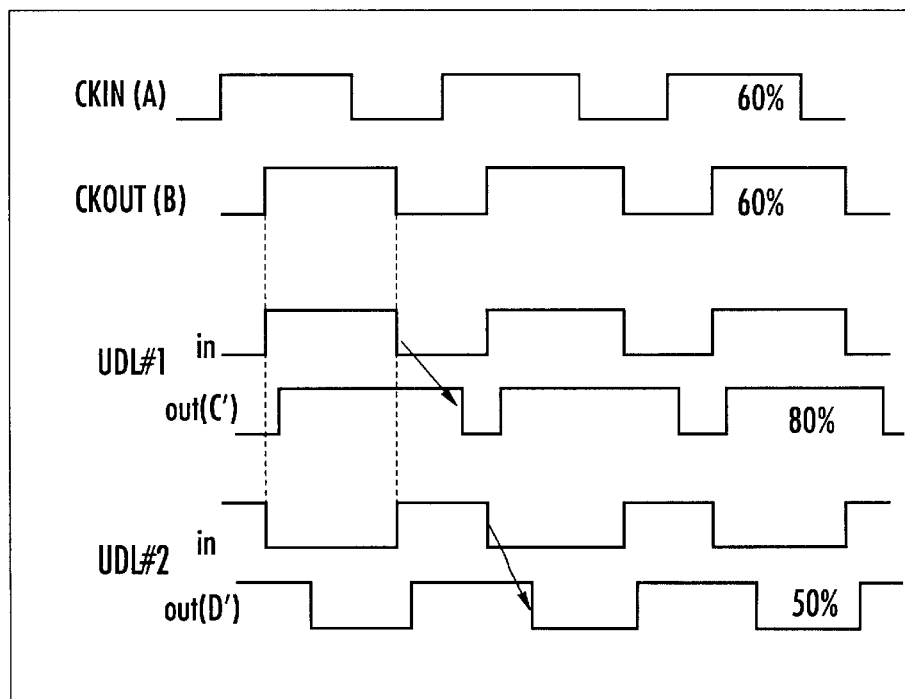
FIG. 3 is a timing diagram illustrating the clock signals from the delay lines during a reset phase according to the present invention.

By assuming an input duty cycle equal to 60% (A) in the diagram 2-1 at reset, the duty cycle of CKOUT is unchanged (B). The UDL#1 saturates (C) the duty cycle earlier than the UDL#2 (D). This is detected by the block TDL and is used by the CDL to regulate the ADL, as depicted in diagram 2-2 (K and L). The waveforms in the delay lines are illustrated in the timing diagrams depicted in FIG. 3. The duty cycle of the clock CKOUT is closer to 50% (L) than it was originally, but UDL#1 still saturates (M) before UDL#2 (N). The ADL is once again regulated, and the duty cycle of the signal CKOUT reaches 50%, as depicted in diagram 2-3 (T). In such situations, UDL#1 and UDL#2 both saturate at practically the same time (U and V) and no further correction is applied.

Requirements of the DCA system of the present invention include a reliable detection of saturation instants, an ADL block with a low insertion delay while still determining an effective adjustment, and the design of unbalanced delay lines UDL#1 and UDL#2.

Figure 4:
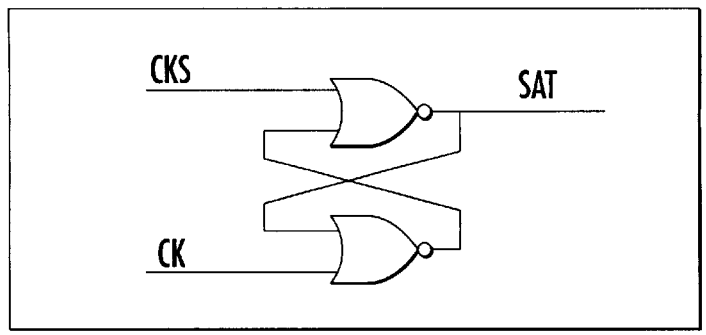
FIG. 4 is a schematic diagram of the saturation detection circuit (R-S latch) according to the present invention.

The problem of detecting saturation of the duty cycle can be solved by applying a low frequency signal CKS and the clock CK to respective inputs of a set-reset (SR) latch. Such a circuit is depicted in FIG. 4. CK is the clock to be processed, i.e., the input clock signal. CKS is a low frequency synchronization signal and SAT is the output flag. Upon reaching duty cycle saturation, the SR latch is not reset. The synchronization signal CKS may be generated by dividing the input clock signal CKIN by 4 or by a higher integer. The divider is identified by the dashed block D in the general diagram of FIG. 1. Alternatively, if a further pin and a low speed external clock are available, the latter can be used as CKS independent of its frequency.

By sampling the signal SAT generated by the set-reset latch, the saturation comparison is easily performed using a logic comparison, e.g., by using an XOR gate. The result of the comparison of each pair of TAPS of the two unbalanced delay lines UDL#1 and UDL#2 can be transformed in the result of a comparison between the whole UDL using a priority comparator.

Figure 5:
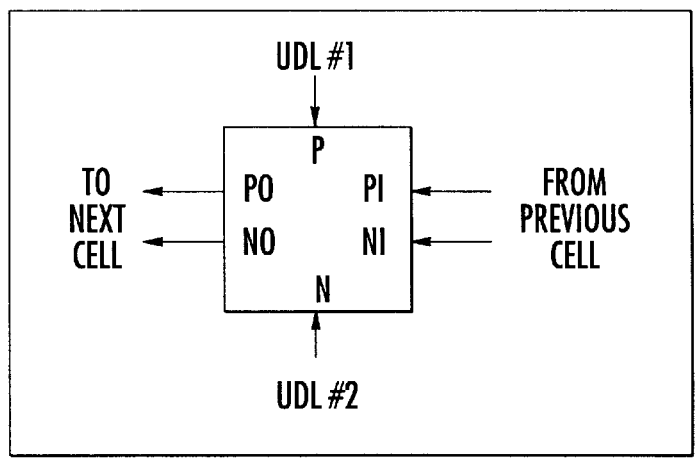
FIG. 5 is a block diagram of the circuit that compares the saturation state according to the present invention.

A single comparator module is depicted in FIG. 5, wherein the P and N are pairs of SAT flags belonging to UDL#1 and UDL#2, respectively. In the case that P or N is high, the information is passed to the leftmost cell or stage, stopping any other information from the rightmost cells or stages. Therefore, the saturation of the leftmost cell is used to decide the correction to be applied. To ensure a fine granularity of the regulation of the duty cycle, the cells of the adjustable delay line ADL use the load variation technique, rather than including or excluding cells in the delay chain.

Figure 6:
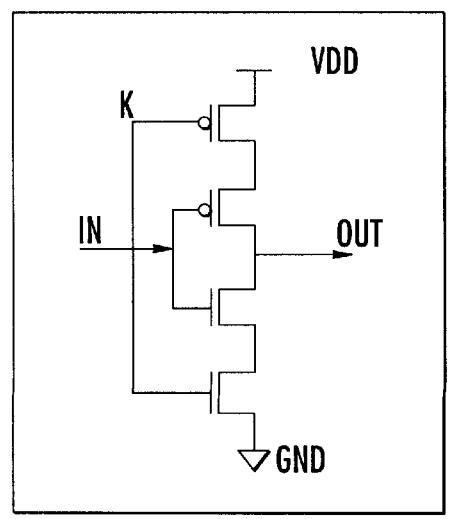
FIG. 6 is a schematic diagram of a CMOS delay module according to the present invention.
Figure 7:
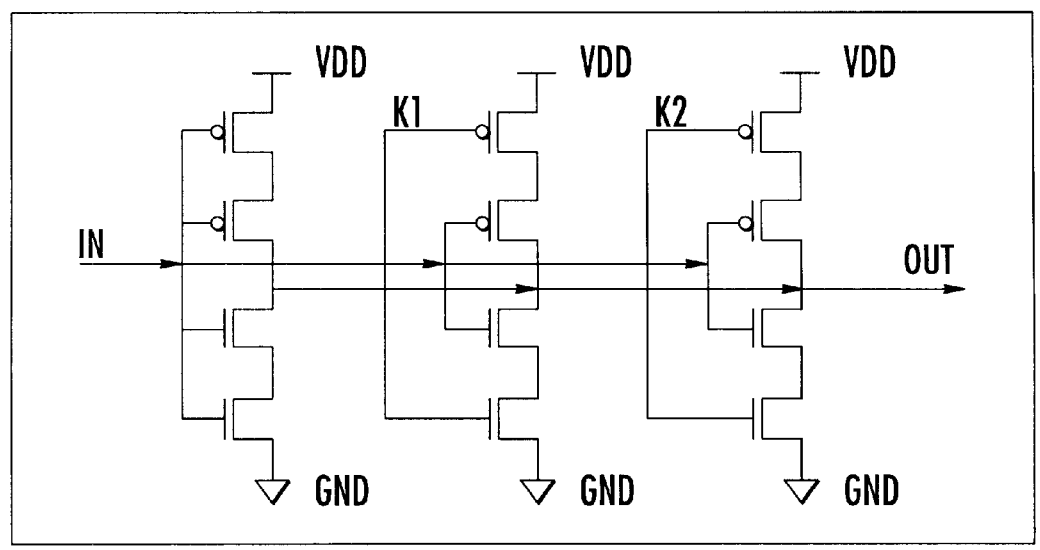
FIG. 7 is a schematic diagram of a modular embodiment of a CMOS delay line according to the present invention.

An example of a CMOS delay cell is depicted in FIG. 6. By changing the value of the digital control signal K, the rise/fall ratio of the transfer function is changed. The circuit of FIG. 6 has a very low insertion delay and can be used in series with and/or in parallel to other elements. The circuit reduces the whole propagation delay of the adjustable delay line ADL, and increases the correction of the duty cycle according to the scheme depicted in FIG. 7, for example. In another embodiment of the cell of FIG. 7, the inputs K and IN can be exchanged without compromising functionality.

Figure 8:
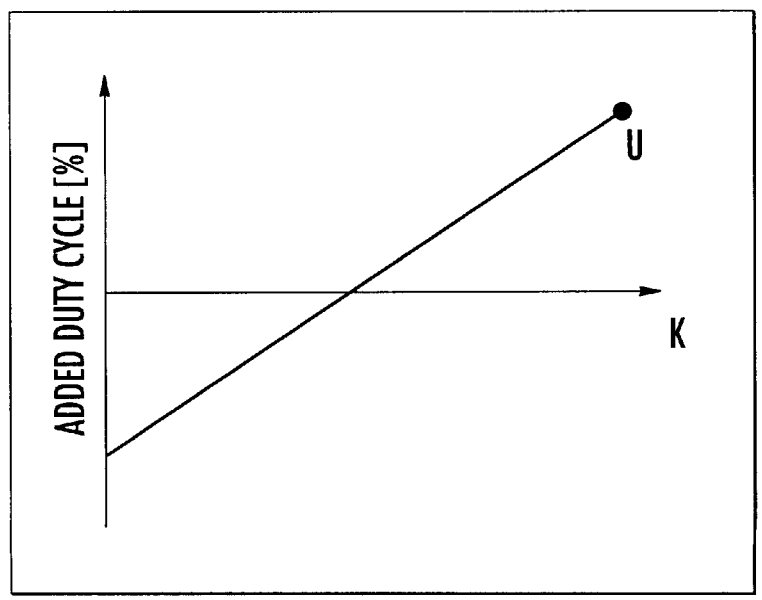
FIG. 8 is a plot of a suitable transfer function of the delay line used to implement the method according to the present invention.

A typical shape of the transfer function is depicted in FIG. 8. A relatively straightforward manner of forming the two unbalanced delay lines UDL#1 and UDL#2 when only standard logic gates are available is to use a chain of digital elements with a driving strength and an input load capacitance alternately high and low. An alternative approach includes using as a delay element the same cell of FIG. 6 and possibly the same scheme of FIG. 7 used for the ADL. In this case the control signal K is fixed, which is point U in the transfer function of FIG. 8.

One of the biggest problems in using delay lines composed of time-dependent cells includes the effects of the spread of the process, of the temperature and of the supply voltage $\{P, V, T\}$ on the time characteristic of a single cell that also influences the duty cycle. Moreover, the clock frequency represents an important parameter in regulating the duty cycle of a clock signal because the duty cycle is measured in percentage with respect to the clock period. Therefore, it can be stated that the set of parameters $\{P, V, T, F\}$ affects the behavior of the DCA.

Effective alternative approaches of accounting for the variations on the set of parameters $\{P, V, T, F\}$ in dimensioning the delay lines ADL, UDL#1 and UDL#2 to make more efficient the operating conditions of the DCA over the entire variation range of the parameters $\{P, V, T, F\}$ are respectively based on the following discussion. First, ADL and UDL elements are added in the respective lines to cover the whole range of variation of $\{P, V, T, F\}$. Second, the ADL and UDL elements are adapted in real time to the actual values of the parameters $\{P, V, T, F\}$.

The first approach is the easiest to design but has the drawbacks of requiring a relatively large area and power dissipation. The second approach may be followed only if a measure of the actual values of $\{P, V, T, F\}$ is either available or may be easily obtained. The latter is the case of a second embodiment of the DCA, that is described below.

Let K be the multiplication coefficient:

$$K = K_P * K_V * K_T * K_F$$

The parameter $K_F$ is not defined in literature, but it is a coefficient that takes into account the frequency differences between the clock of the application and the particular nominal value for which the DCA is designed.

In case no saturation occurs in the two UDL lines, then K is excessively low and the duty cycle is not sufficiently degraded by the UDL. On the contrary, if the saturation of both the UDLs occur relatively early, then K is high and the duty cycle is being excessively degraded by the UDLs.

Figure 9:
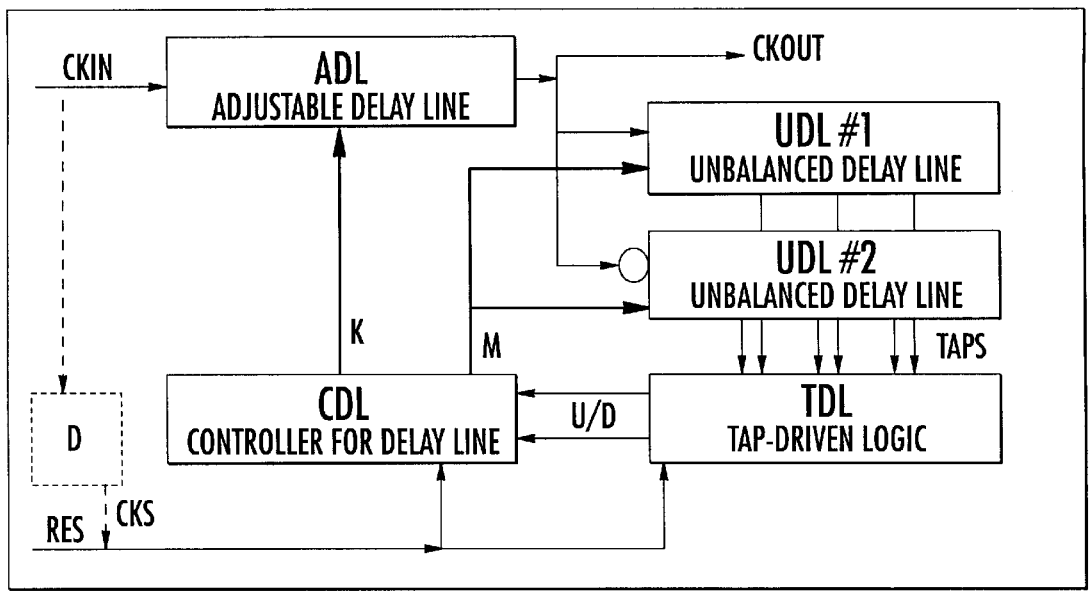
FIG. 9 is a block diagram of a second embodiment of the DCA according to th e present invention.

The DCA of FIG. 1 can be easily modified by expanding the functions of the control block CDL to let it handle not only the ADL line through the bus K, but also the two lines UDL#1 and UDL#2 through a second bus M, as illustrated in FIG. 9. The control of the UDLs is carried out with the same method used to control the ADL block. The flags monitored are those of the saturation of the first and of the last element of the UDL lines. The effect of the control carried out on the UDL is to vary the slope of the relative characteristics illustrated in FIG. 2 to saturate in the most suitable manner for enhancing the accuracy of the measure of the duty cycle.

Figure 10:
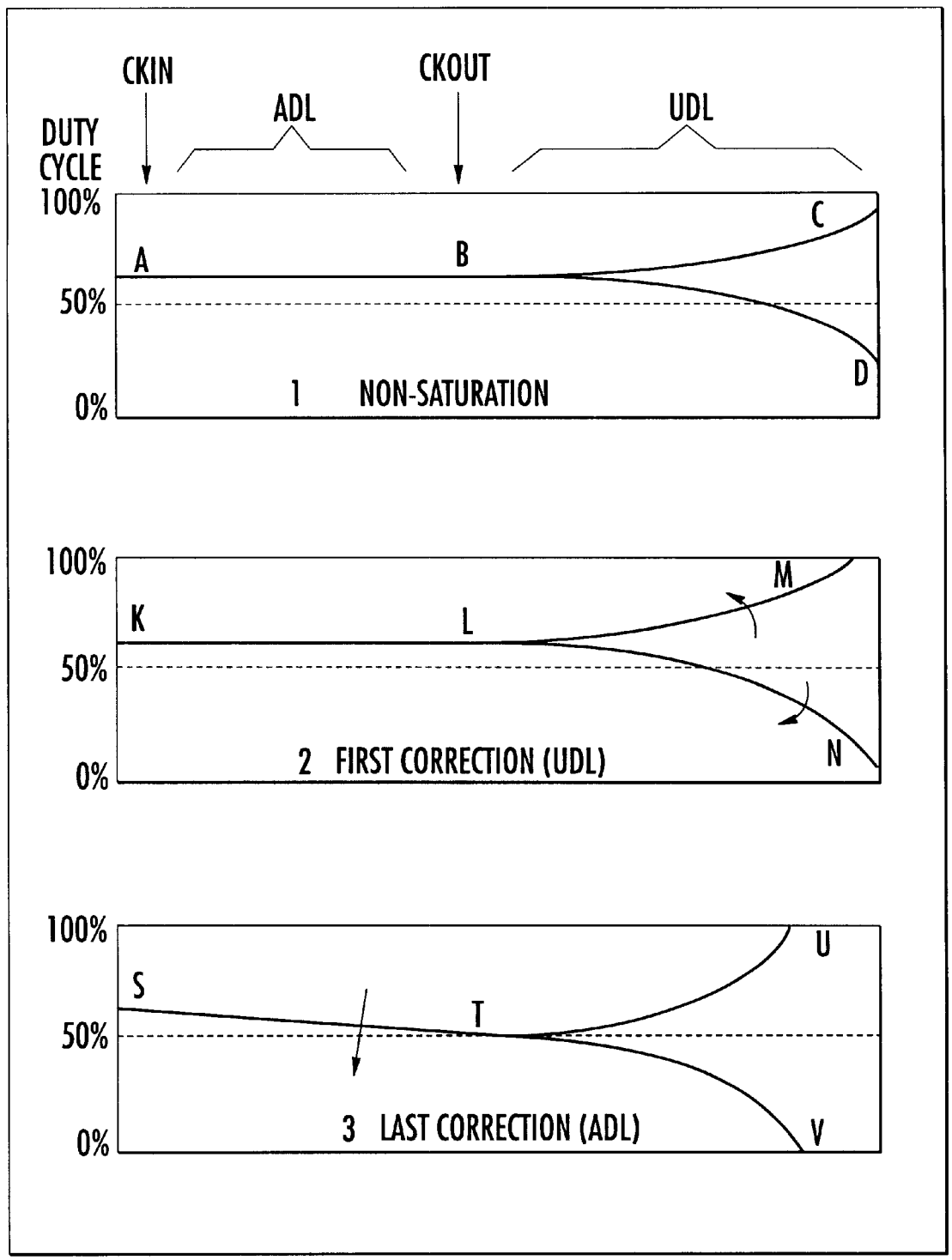
FIG. 10 is a graph illustrating the duty cycle of clock signals during corrections carried out b y the DCA illustrated in FIG. 8.

Similar to the graphical representation used for FIG. 2, the operation of the improved DCA is depicted in FIG. 10. If saturation is not reached (diagram 10-1), only the UDLs are regulated to increment their degrading factor. When at least one (M) of the UDLs saturates (diagram 10-2), the controller intervenes for regulating the ADL line until saturation of both lines (U, V) occur almost at the same instant (diagram 10-3). When saturation is reached too early, the UDLs are corrected to reduce their degrading factor of the duty cycle and to reach the state of diagram 10-3, thus reducing the slopes of the saturation characteristics to obtain an enhanced precision in regulating the duty cycle.

When power consumption is important, an enable signal can be used to disable all the blocks that form the DCA of the invention with the exception of the block ADL. This can be done either when the duty cycle of the output clock is equal to 50%, or periodically, during operation.

Figure 11:
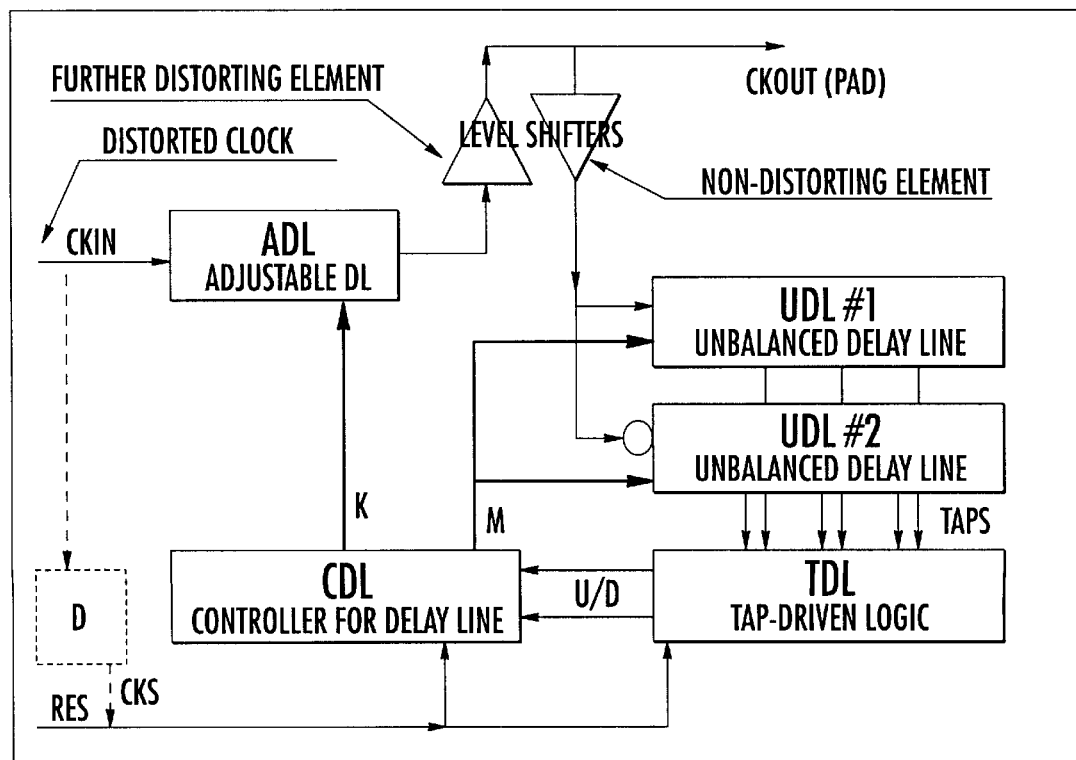
FIG. 11 is a block diagram of a third embodiment of the DCA according to the present invention.

It is evident that single elements of the DCA of the invention can be used in a stand-alone manner or be usefully incorporated in particular subsystems. For example, an embodiment in which the distortion of the duty cycle is created by an output buffer on an ASIC (e.g., a level shifter) is depicted in FIG. 11. The DCA of the invention can be advantageously used, in this case, to regulate the duty cycle of the clock outside the ASIC by feeding-back the shifted level. In this type of application the DCA of the invention is effective in regulating clock signals regardless of their logic level.

That which is claimed is:

1. A method for regulating a duty cycle of a first clock signal, the method comprising:
   generating a second clock signal by varying the duty cycle of the first clock signal using an adjustable delay circuit;
   applying the second clock signal to a first delay line and to a second delay line for respectively increasing and decreasing a duty cycle of the second clock signal;
   monitoring the first and second delay lines to determine which delay line saturates first; and
   regulating a delay introduced by the adjustable delay circuit so that saturation of the first and second delay lines occur at substantially a same time.

2. A method according to claim 1, wherein the duty cycle of the first clock signal is regulated to 50%.

3. A method according to claim 1, wherein the first and second delay lines respectively vary the duty cycle of the second clock signal a same amount but at opposite signs.

4. A method according to claim 1, wherein the second delay line is identical to the first delay line; and wherein applying the second clock signal to the second delay line further comprises inverting the second clock signal before being applied thereto.

5. A method for regulating a duty cycle of a first clock signal, the method comprising:
   generating a second clock signal by varying the duty cycle of the first clock signal using an adjustable delay circuit;
   applying the second clock signal to a first delay line and to a second delay line for respectively increasing and decreasing a duty cycle of the second clock signal;
   monitoring the first and second delay lines to determine which delay line saturates first; and
   regulating a delay introduced by the adjustable delay circuit and varying respective characteristics of the first and second delay lines so that saturation of the first and second delay lines occur at substantially a same time.

6. A method according to claim 5, wherein the duty cycle of the first clock signal is regulated to 50%.

7. A method according to claim 5, wherein the first and second delay lines respectively vary the duty cycle of the second clock signal a same amount but at opposite signs.

8. A method according to claim 5, wherein the second delay line is identical to the first delay line; and wherein applying the second clock signal to the second delay line further comprises inverting the second clock signal before being applied thereto.

9. A circuit for regulating a duty cycle of a clock signal comprising:
   an adjustable delay line having an input for receiving the clock signal, said adjustable delay line for generating a second clock signal by varying the duty cycle of the clock signal;
   first and second delay lines each receiving the second clock signal for respectively increasing and decreasing a duty cycle of the second clock signal;
   a logic circuit for comparing a logic state of said first and second delay lines for generating a signal indicating which of said first and second delay lines saturate first; and
   a control circuit connected to said adjustable delay line and to said logic circuit for increasing the duty cycle of the second clock signal if said second delay line saturates before said first delay line saturates, or decreasing the duty cycle of the second clock signal if said first delay line saturates before said second delay line saturates.

10. A circuit according to claim 9, wherein said control circuit is connected to said first and second delay lines for varying respective characteristics thereof so that saturation of said first and second delay lines occur at substantially a same time.

11. A circuit according to claim 9, wherein said adjustable delay line comprises at least one CMOS stage comprising an internal pair of transistors and an external pair of transistors connected together between first and second voltage references.

12. A circuit according to claim 11, wherein said internal pair of transistors comprises respective control terminals connected together for forming an inverter and for receiving the clock signal; and wherein said external pair of transistors comprises respective control terminals connected together for receiving a driving signal generated by said control circuit.

13. A circuit according to claim 11, wherein said internal pair of transistors comprises respective control terminals connected together for forming an inverter and for receiving a driving signal generated by said control circuit; and wherein said external pair of transistors comprises respective control terminals connected together for receiving the clock signal.

14. A circuit according to claim 9, wherein the duty cycle is regulated to about 50%.

15. A circuit according to claim 9, wherein said second delay line is identical to said first delay line, and said second delay line further comprises an inverting input stage connected thereto.

16. A circuit according to claim 9, wherein said logic circuit comprises:
- a plurality of set-reset latches for detecting the logic state of said first and second delay lines; and
- a comparator connected to said plurality of set-reset latches for determining which one of said first and second delay lines saturates first.

17. A circuit for regulating a duty cycle of a clock signal comprising:
- an adjustable delay line having an input for receiving the clock signal, said adjustable delay line for generating a second clock signal by varying the duty cycle of the clock signal;
- first and second delay lines each receiving the second clock signal for respectively increasing and decreasing a duty cycle of the second clock signal;
- a logic circuit for comparing a logic state of said first and second delay lines for generating a signal indicating which of said first and second delay lines saturate first; and
- a control circuit connected to said adjustable delay line, to said logic circuit, and to said first and second delay lines for regulating a delay introduced by said adjustable delay circuit and varying respective characteristics of said first and second delay lines so that saturation of the first and second delay lines occur at substantially a same time.

18. A circuit according to claim 17, wherein said control circuit increases the duty cycle of the second clock signal if said second delay line saturates before said first delay line saturates, or decreases the duty cycle of the second clock signal if said first delay line saturates before said second delay line saturates.

19. A circuit according to claim 17, wherein said adjustable delay line comprises at least one CMOS stage comprising an internal pair of transistors and an external pair of transistors connected together between first and second voltage references.

20. A circuit according to claim 19, wherein said internal pair of transistors comprises respective control terminals connected together for forming an inverter and for receiving the clock signal; and wherein said external pair of transistors comprises respective control terminals connected together for receiving a driving signal generated by said control circuit.

21. A circuit according to claim 19, wherein said internal pair of transistors comprises respective control terminals connected together for forming an inverter and for receiving a driving signal generated by said control circuit; and wherein said external pair of transistors comprises respective control terminals connected together for receiving the clock signal.

22. A circuit according to claim 17, wherein the duty cycle is regulated to about 50%.

23. A circuit according to claim 17, wherein said second delay line is identical to said first delay line, and said second delay line further comprises an inverting input stage connected thereto.

24. A circuit according to claim 17, wherein said logic circuit comprises:
- a plurality of set-reset latches for detecting the logic state of said first and second delay lines; and
- a comparator connected to said plurality of set-reset latches for determining which one of said first and second delay lines saturates first.

* * * * *